(12) United States Patent
Togasaki et al.

(10) Patent No.: US 12,660,090 B2
(45) Date of Patent: Jun. 16, 2026

(54) METHOD FOR PRODUCING WIRING BOARD, AND WIRING BOARD

(71) Applicant: Resonac Corporation, Tokyo (JP)

(72) Inventors: Kei Togasaki, Tokyo (JP); Kenichi Iwashita, Tokyo (JP); Keishi Ono, Tokyo (JP); Mao Narita, Tokyo (JP); Kazuyuki Mitsukura, Tokyo (JP); Masaya Toba, Tokyo (JP)

( * ) Notice: Subject to any disclaimer, the term of this patent is extended or adjusted under 35 U.S.C. 154(b) by 521 days.

(21) Appl. No.: 18/044,789

(22) PCT Filed: Sep. 9, 2021

(86) PCT No.: PCT/JP2021/033172
§ 371 (c)(1),
(2) Date: Mar. 10, 2023

(87) PCT Pub. No.: WO2022/054873
PCT Pub. Date: Mar. 17, 2022

(65) Prior Publication Data

US 2024/0015889 A1 Jan. 11, 2024

(30) Foreign Application Priority Data

Sep. 11, 2020 (JP) ................................ 2020-153096

(51) Int. Cl.
*H05K 1/181* (2026.01)
*H05K 3/02* (2006.01)
(Continued)

(52) U.S. Cl.
CPC ............ *H05K 1/181* (2013.01); *H05K 3/022* (2013.01); *H05K 3/1208* (2013.01); *H05K 3/181* (2013.01)

(58) Field of Classification Search
CPC ...... H05K 3/022; H05K 3/108; H05K 3/1208; H05K 3/181; H05K 3/188; C25D 5/02; C25D 5/34
See application file for complete search history.

(56) References Cited

U.S. PATENT DOCUMENTS

2009/0238956 A1 * 9/2009 Kojima .................. H05K 3/108 427/98.5
2011/0214994 A1 * 9/2011 Utsumi .................... C25D 5/34 205/211
(Continued)

FOREIGN PATENT DOCUMENTS

CN 104342701 2/2015
CN 106462067 2/2017
(Continued)

OTHER PUBLICATIONS

International Preliminary Report on Patentability with Written Opinion dated Mar. 23, 2023 for PCT/JP2021/033172.
(Continued)

*Primary Examiner* — Nathan Milakovich
(74) *Attorney, Agent, or Firm* — SHIPWAY IP

(57) ABSTRACT

A method for producing a wiring board, including: a step of pretreating the surface of a metal layer exposed into an opening by bringing the surface into contact with a pretreatment liquid at a predetermined pretreatment temperature; and a step of forming a copper plating layer on the metal layer by electrolytic plating. The resist layer and the pretreatment liquid are selected such that a mass change rate of the resist layer when the resist layer before being exposed and developed is immersed in the pretreatment liquid is −2.0% by mass or more. The mass change rate is a value calculated by Expression: Mass change rate (% by mass)={(W1−W0)/W0}×100. W1 is the mass of the resist layer after
(Continued)

a laminated body including a resist layer 3 and a copper foil is immersed in the pretreatment liquid at the pretreatment temperature for 30 minutes.

5 Claims, 2 Drawing Sheets

(51) Int. Cl.
*H05K 3/12* (2006.01)
*H05K 3/18* (2006.01)

(56) References Cited

U.S. PATENT DOCUMENTS

| | | | | |
|---|---|---|---|---|
| 2021/0153358 A1* | 5/2021 | Sakai | C25D 5/022 | |
| 2023/0253215 A1* | 8/2023 | Toba | C25D 5/48 | 205/126 |
| 2024/0341039 A1* | 10/2024 | Togasaki | H05K 3/108 | |

FOREIGN PATENT DOCUMENTS

| | | |
|---|---|---|
| JP | 2004-006773 | 1/2004 |
| JP | 2009-242860 | 10/2009 |
| JP | 2009-260216 | 11/2009 |
| JP | 2011-179085 | 9/2011 |
| JP | 2019-197851 | 11/2019 |
| WO | 2012/137838 | 10/2012 |

OTHER PUBLICATIONS

International Search Report dated Nov. 30, 2021 for PCT/JP2021/033172.

* cited by examiner

METHOD FOR PRODUCING WIRING BOARD, AND WIRING BOARD

CROSS-REFERENCE TO RELATED APPLICATIONS

This application is a 35 U.S.C. § 371 national phase application of PCT/JP2021/033172, filed on Sep. 9, 2021, which claims priority to Japanese Patent Application No. 2020-153096, filed on Sep. 11, 2020.

TECHNICAL FIELD

The present disclosure relates to a method for producing a wiring board, and a wiring board.

BACKGROUND ART

In order to respond to demands such as the downsizing, the weight saving, and the speeding-up of an electronic device, a wiring board configuring the electronic device is required to include a wiring with a minute width. As a method for forming the wiring with a minute width, a semi-additive (SAP) method and a modified semi-additive (MSAP) method have been widely used (Patent Literature 1). In general, such methods include a step of forming a copper plating layer on a metal layer by electrolytic plating.

CITATION LIST

Patent Literature

Patent Literature 1: Japanese Unexamined Patent Publication No. 2004-6773

SUMMARY OF INVENTION

Technical Problem

In a case where the copper plating layer is formed on the metal layer as a seed layer by the electrolytic plating, in the vicinity of the interface between the metal layer and the copper plating layer, minute black parts with a width of less than 0.3 μm may be observed in the copper plating layer. The black parts are estimated as minute voids. Since the black part is an extremely minute void, it is not likely to affect the properties of the wiring itself, but in a case where there are many minute voids due to further micronizing of the width of the wiring, there is a concern that adhesiveness between the copper plating layer and the metal layer can be insufficient.

One aspect of the present disclosure relates to a method for suppressing the occurrence of a minute black part in the vicinity of the interface between a metal layer and a copper plating layer in a case where a wiring board is produced by a method including forming the copper plating layer on the metal layer by electrolytic plating.

Solution to Problem

An aspect of the present disclosure relates to a method for producing a wiring board, including: a step of forming a resist layer on a metal layer provided on a support body; a step of forming a pattern including an opening to which the metal layer is exposed on the resist layer by exposing and developing the resist layer; a step of pretreating a surface of the metal layer exposed into the opening by bringing the surface into contact with a pretreatment liquid at a predetermined pretreatment temperature; and a step of forming a copper plating layer on the metal layer by electrolytic plating, in this order. The resist layer and the pretreatment liquid are selected such that a mass change rate of the resist layer when the resist layer before being exposed and developed is immersed in the pretreatment liquid is −2.0% by mass or more. The mass change rate is a value calculated by the following expression:

$$\text{Mass change rate (\% by mass)}=\{(W1-W0)/W0\}\times 100,$$

W0 is a mass of the resist layer before being immersed in the pretreatment liquid, and W1 is a mass of the resist layer after a laminated body including the resist layer and a copper foil covering entire one surface of the resist layer is immersed in the pretreatment liquid at the pretreatment temperature for 30 minutes.

Advantageous Effects of Invention

According to an aspect of the present disclosure, the method for suppressing the occurrence of the minute black part in the vicinity of the interface between the metal layer and the copper plating layer in a case where the wiring board is produced by the method for forming the copper plating layer on the metal layer by the electrolytic plating is provided.

DESCRIPTION OF EMBODIMENTS

The present invention is not limited to the following examples.

Figure 1:
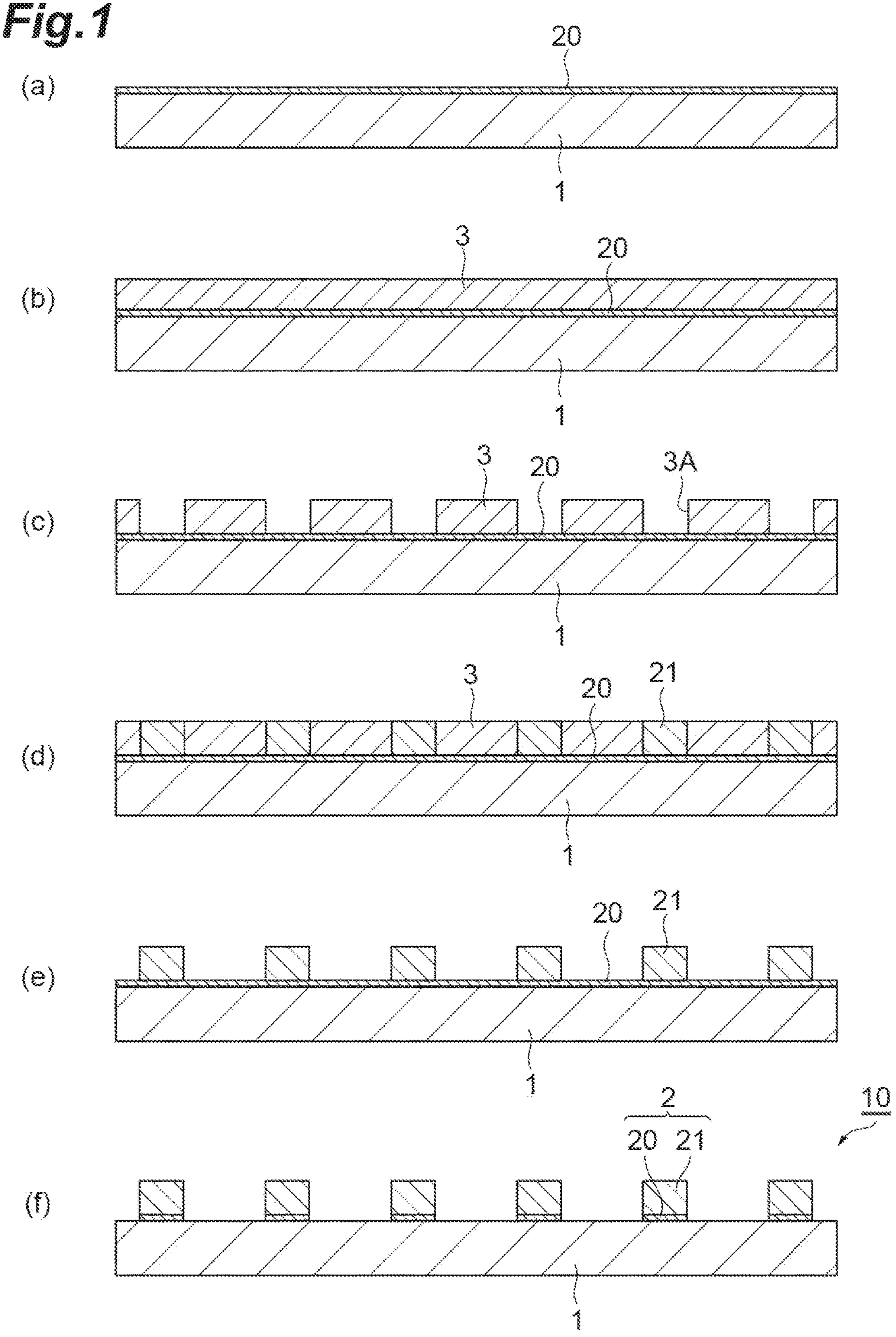
FIG. 1 is a sectional view illustrating an example of a method for producing a wiring board.

FIG. 1 is a sectional view illustrating an example of a method for producing a wiring board. The method illustrated in FIG. 1 includes a step of forming a metal layer 20 on one main surface of a plate-shaped support body 1, a step of forming a resist layer 3 on the metal layer 20, a step of forming a pattern including an opening 3A to which the metal layer 20 is exposed on the resist layer 3 by exposing and developing the resist layer 3, a step of pretreating the surface of the metal layer 20 exposed into the opening 3A by bringing the surface into contact with a pretreatment liquid at a predetermined pretreatment temperature, a step of forming a copper plating layer 21 on the metal layer 20 by electrolytic plating, a step of removing the resist layer 3 to expose a portion of the metal layer 20 that is not covered with the copper plating layer 21, and a step of removing the metal layer 20 in the exposed portion to form a wiring board 10 that includes a wiring 2 including the metal layer 20 and the copper plating layer 21, and the support body 1, in this order.

In general, the outermost layer of the support body 1 on a side where the metal layer 20 is provided mainly includes an insulating layer. The insulating layer that is provided as the outermost layer of the support body 1, for example, may be an insulating resin layer such as a build-up layer. The support body 1 may include a wiring that is connected to the wiring 2. The support body 1 may include an insulating board that is a laminated plate including a plurality of prepregs.

The metal layer 20 is a layer that functions as a seed layer for electrolytic plating. The metal layer 20, for example, may be a metal plating layer formed by electroless plating, a metal foil such as a copper foil, a layer formed by vapor deposition such as sputtering, or a sintered metal layer. The sintered metal layer is a layer formed by heating a coating film containing metal particles, and by sintering the metal particles. The metal configuring the metal layer 20, for example, may include at least one type of metal selected from the group consisting of copper, gold, silver, tungsten, molybdenum, tin, cobalt, chromium, iron, and zinc. The metal layer 20 may be a single layer, or may include two or more layers. The thickness of the metal layer 20, for example, may be 0.1 to 2.0 μm.

Arithmetic surface roughness Ra of the surface of the metal layer on a side opposite to the support body 1 may be 0.20 to 0.30 μm. An average height Rc of the surface of the metal layer 20 on a side opposite to the support body 1 may be 0.7 to 1.3 μm. In a case where the arithmetic surface roughness Ra and/or the average height Rc are in the range described above, more excellent effects are easily obtained from the viewpoint of reducing black parts in the copper plating layer.

The resist layer 3 can be formed by selecting a photosensitive resist material that is generally used to form a wiring, on the basis of a mass change rate due to the immersion to a pretreatment liquid as described below. The thickness of the resist layer 3, for example, may be 10 to 50 μm.

A resist material for forming the resist layer 3, for example, may be a photosensitive resin composition containing a binder polymer, a photopolymerizable compound having an ethylenically unsaturated bond, and a photopolymerization initiator.

The binder polymer, for example, may be a copolymer containing benzyl (meth)acrylate or a derivative thereof, styrene or a styrene derivative, alkyl (meth)acrylic acid ester, and a (meth)acrylic acid as a monomer unit.

Specific examples of the benzyl (meth)acrylate derivative configuring the binder polymer include 4-methyl benzyl (meth)acrylate, 4-ethyl benzyl (meth)acrylate, 4-tertbutyl benzyl (meth)acrylate, 4-methoxybenzyl (meth)acrylate, 4-ethoxybenzyl (meth)acrylate, 4-hydroxyl benzyl (meth) acrylate, and 4-chlorobenzyl (meth)acrylate.

Specific examples of the styrene derivative configuring the binder polymer include vinyl toluene, p-methyl styrene, and p-chlorostyrene.

The alkyl (meth)acrylic acid ester configuring the binder polymer may be an ester compound containing a (meth) acrylic acid and linear or branched aliphatic alcohol having 1 to 12 carbon atoms. The number of carbon atoms of the aliphatic alcohol may be 1 to 8, or 1 to 4. Specific examples of the alkyl (meth)acrylic acid ester include methyl (meth) acrylate, ethyl (meth)acrylate, propyl (meth)acrylate, isopropyl (meth)acrylate, butyl (meth)acrylate, tert-butyl (meth)acrylate, pentyl (meth)acrylate, hexyl (meth)acrylate, heptyl (meth)acrylate, octyl (meth)acrylate, and 2-ethyl hexyl (meth)acrylate.

The ratio of a monomer unit derived from the benzyl (meth)acrylate and the derivative thereof in the binder polymer may be 50 to 80% by mass, 50 to 75% by mass, 50 to 70% by mass, or 50 to 65% by mass, on the basis of the mass of the binder polymer. The ratio of a monomer unit derived from the styrene or the styrene derivative in the binder polymer may be 5 to 40% by mass, or 5 to 35% by mass, on the basis of the mass of the binder polymer. The ratio of a monomer unit derived from the alkyl (meth)acrylic acid ester in the binder polymer may be 1 to 20% by mass, 1 to 15% by mass, 1 to 10% by mass, or 1 to 5% by mass, on the basis of the mass of the binder polymer. The ratio of a monomer unit derived from the (meth)acrylic acid in the binder polymer may be 5 to 30% by mass, 5 to 25% by mass, or 10 to 25% by mass, on the basis of the mass of the binder polymer.

A weight average molecular weight (Mw) of the binder polymer may be 20000 to 150000, 30000 to 100000, 40000 to 80000, or 40000 to 60000. Here, the weight average molecular weight indicates a standard polystyrene equivalent that is obtained by gel permeation chromatography (GPC).

An acid value (mgKOH/g) of the binder polymer may be 13 to 78, 39 to 65, or 52 to 62. Here, the acid value indicates the amount (mg) of potassium hydroxide that is required for the neutralization of 1 g of the binder polymer.

Specific examples of the photopolymerizable compound having an ethylenically unsaturated bond include a bisphenol A-based (meth)acrylate compound, a hydrogenerated bisphenol A-based (meth)acrylate compound, polyalkylene glycol (meth)acrylate, a urethane monomer, pentaerythritol (meth)acrylate, and trimethylol propane (meth)acrylate. Only one type of the photopolymerizable compounds is used, or two or more types thereof are used in combination. A bisphenol A-based di(meth)acrylate compound, for example, may be a compound represented by General Formula (1) described below.

(1)

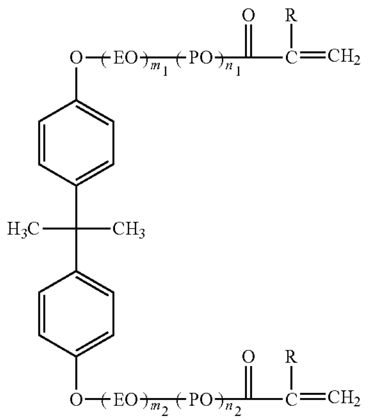

In Formula (1), Rs each independently represent a hydrogen atom or a methyl group. EO and PO each represent an oxyethylene group and an oxypropylene group. $m_1$, $m_2$, $n_1$, and $n_2$ each independently represent 0 to 40, $m_1+m_2$ is 1 to 40, and $n_1+n_2$ is 0 to 20. Either EO or PO may be on a phenolic hydroxyl group side. $m_1$, $m_2$, $n_1$, and $n_2$ each represent the number of EOs or POs. A compound in which $m_1+m_2$ is 5 or less on average and a compound in which $m_1+m_2$ is 6 to 40 on average may be combined.

The polyalkylene glycol (meth)acrylate may be a compound represented by Formula (2) described below. As the photopolymerizable compound having an ethylenically unsaturated bond, the bisphenol A-based di(meth)acrylate compound and the compound represented by Formula (2) described below may be combined.

(2)

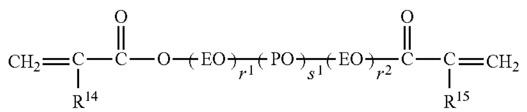

In Formula (2), $R^{14}$ and $R^{15}$ each independently represent a hydrogen atom or a methyl group, EO and PO are the same as described above, $s^1$ represents 1 to 30, $r^1$ and $r^2$ each represent 0 to 30, and $r^1+r^2$ is 1 to 30. Examples of a commercially available product of the compound represented by Formula (2) include a vinyl compound (Product Name: FA-023M, manufactured by Showa Denko Materials Co., Ltd.) in which $R^{14}$ and $R^{15}$ are a methyl group, $r^1+r^2=4$ (an average value), and $s^1=12$ (an average value).

Specific examples of the photopolymerization initiator include aromatic ketone such as benzophenone, N,N'-tetramethyl-4,4'-diaminobenzophenone (Michler's Ketone), N,N'-tetraethyl-4,4'-diaminobenzophenone, 4-methoxy-4'-dimethyl aminobenzophenone, 2-benzyl-2-dimethyl amino-1-(4-morpholinophenyl)-butanone-1, and 2-methyl-1-[4-(methyl thio)phenyl]-2-morpholino-propanone-1; quinones such as 2-ethyl anthraquinone, phenanthrene quinone, 2-tert-butyl anthraquinone, octamethyl anthraquinone, 1,2-benzanthraquinone, 2,3-benzanthraquinone, 2-phenyl anthraquinone, 2,3-diphenyl anthraquinone, 1-chloroanthraquinone, 2-methyl anthraquinone, 1,4-naphthoquinone, 9,10-phenanthraquinone, 2-methyl 1,4-naphthoquinone, and 2,3-dimethyl anthraquinone; a benzoin ether compound such as benzoin methyl ether, benzoin ethyl ether, and benzoin phenyl ether; a benzoin compound such as benzoin, methyl benzoin, and ethyl benzoin; a benzyl derivative such as benzyl dimethyl ketal; a 2,4,5-triaryl imidazole dimer such as a 2-(o-chlorophenyl)-4,5-diphenyl imidazole dimer, a 2-(o-chlorophenyl)-4,5-di(methoxyphenyl) imidazole dimer, a 2-(o-fluorophenyl)-4,5-diphenyl imidazole dimer, a 2-(o-methoxyphenyl)-4,5-diphenyl imidazole dimer, and a 2-(p-methoxyphenyl)-4,5-diphenyl imidazole dimer; an acridine derivative such as 9-phenyl acridine and 1,7-bis(9,9'-acridinyl) heptane; N-phenyl glycine; a N-phenyl glycine derivative; and a coumarin-based compound. Only one type of the photopolymerization initiators is used, or two or more types thereof are used in combination. The photopolymerization initiator may contain the 2,4,5-triaryl imidazole dimer, in particular, the 2-(O-chlorophenyl)-4,5-diphenyl imidazole dimer.

The content of the binder polymer in the photosensitive resin composition may be 40 to 80 parts by mass, 45 to 75 parts by mass, or 50 to 70 parts by mass, with respect to 100 parts by mass of the total amount of the binder polymer and the photopolymerizable compound. The content of the photopolymerization initiator in the photosensitive resin composition may be 0.01 to 5 parts by mass, 0.1 to 4.5 parts by mass, or 1 to 4 parts by mass, with respect to 100 parts by mass of the total amount of the binder polymer and the photopolymerizable compound.

The photosensitive resin composition may contain other components, as necessary. Examples of the other components include a photopolymerizable compound having a cationically polymerizable cyclic ether group, a cationic polymerization initiator, a sensitizer, a colorant such as malachite green, a photochromic agent such as tribromomethyl phenyl sulfone and Leuco Crystal Violet, a thermochromic inhibitor, a plasticizer such as p-toluene sulfone amide, a pigment, a filler, a defoamer, a flame retardant, a stabilizer, a adhesiveness imparting agent, a leveling agent, a peeling accelerator, an antioxidant, a fragrance, an imaging agent, and a thermal cross-linking agent. Each content of the other components may be approximately 0.01 to 20 parts by mass with respect to 100 parts by mass of the total amount of the binder polymer and the photopolymerizable compound.

The total content of the binder polymer, the photopolymerizable compound, and the photopolymerization initiator in the photosensitive resin composition may be 90 to 100% by mass, or 95 to 100% by mass, with respect to the total mass of the components other than a solvent in the photosensitive resin composition.

In order to form the resist layer 3, the resist film containing the photosensitive resin composition may be laminated on the metal layer 20, or the photosensitive resin composition containing a solvent may be applied to the metal layer 20, and the solvent may be removed from the coating film.

A part of the resist layer 3 is exposed, and the resist layer 3 after being exposed is developed to form the resist layer 3 having the pattern including the opening 3A. The exposure and development can be performed by a general method known to a person skilled in the art. By the exposure using a photomask, a fine pattern including the opening 3A to which the metal layer 20 is exposed is formed. A developer for development may be an alkaline aqueous solution such as an aqueous solution of sodium carbonate.

Subsequently, the surface of the metal layer 20 exposed into the opening 3A is pretreated by being brought into contact with a pretreatment liquid at a predetermined pretreatment temperature. For example, by immersing an intermediate structure including the support body 1, the metal layer 20, and the resist layer 3 having the pattern in the pretreatment liquid that is adjusted to be at the predetermined pretreatment temperature, it is possible to pretreat the surface of the metal layer 20. The pretreatment temperature may be suitably set in accordance with the type of pretreatment liquid, or the like, and for example, may be in a range of 20° C. to 50° C. A time for immersion to the pretreatment liquid, for example, may be 1 to 8 minutes.

The pretreatment liquid can be selected from pretreatment liquids that are generally used as a pretreatment liquid for electrolytic plating, on the basis of the mass change rate due to the immersion of the resist layer 3 to the pretreatment liquid as described below. The pretreatment liquid may be acidic, or may contain alcohol. The content of the alcohol may be 0.2 to 5% by mass, on the basis of the mass of the pretreatment liquid.

The pretreatment liquid, for example, may be an acidic aqueous solution containing an acid component, an additive for electrolytic plating, and a reductant.

The acid component may be an organic acid, an inorganic acid, or a combination thereof, and specific examples thereof include a sulfuric acid; an alkane sulfonic acid such as a methane sulfonic acid and a propane sulfonic acid; an alkanol sulfonic acid such as an isethionic acid and a propanol sulfonic acid; and a carboxylic acid such as a citric acid, a tartaric acid, and a formic acid. Only one type of the acid components is used, or two or more types thereof are used in combination. The concentration of the acid component in the pretreatment liquid may be 10 to 300 g/L, or 50 to 200 g/L, on the basis of the volume of the pretreatment liquid.

The additive for electrolytic plating, for example, may be a polyether compound, an organic sulfur compound, or a combination thereof. Examples of the polyether compound include polyethylene glycol, polypropylene glycol, and a derivative thereof. The organic sulfur compound is a copper plating precipitation accelerator that may be referred to as a brightener, and examples thereof include a 3-mercaptopropane sulfonic acid and a bis(3-sulfopropyl) disulfide disodium salt. The concentration of the additive in the pretreatment liquid may be 0.1 to 10000 mg/L, on the basis of the volume of the pretreatment liquid.

Examples of the reductant include a hypophosphite, a phosphite, dimethyl amine borane, trimethyl amine borane, a hydrazine derivative, a borohydride salt, an aldehyde compound (for example, formalin and a glyoxylic acid), titanium trichloride, catechol, resorcine, hydroquinone, an ascorbate, phenylene diamine, and a phosphinic acid derivative. Only one type of the reductants is used, or two or more types thereof are used in combination. The concentration of the reductant in the pretreatment liquid may be 0.0001 to 0.1 mol/L, on the basis of the volume of the pretreatment liquid.

The pretreatment liquid may further contain a surfactant selected from an alkyl benzene sulfonate, a compound having an acetylene group, and the like. The pretreatment liquid may contain a carboxylic acid or an alkane sulfonic acid, an inorganic acid selected from a hydrochloric acid, a sulfuric acid, a phosphoric acid, and a nitric acid, an alkyl benzene sulfonate, and a compound having an acetylene group. In this case, the content of the carboxylic acid and the alkane sulfonic acid may be 5 to 50 g/L, or 10 to 20 g/L, on the basis of the volume of the pretreatment liquid, and the content of the inorganic acid may be 1 to 20 g/L, or 2 to 10 g/L, on the basis of the volume of the pretreatment liquid.

The alkyl benzene sulfonate is a salt of a sulfonic acid compound having a benzene ring, and an alkyl group and a sulfonic acid group bonded to the benzene ring. The number of carbon atoms of the alkyl group may be 10 to 16. The alkyl benzene sulfonate may be a sodium salt, a potassium salt, or a triethanol amine salt. Specific examples of the alkyl benzene sulfonate include sodium linear-dodecylbenzenesulfonate. The content of the alkyl benzene sulfonate may be 0.5 to 20 g/L, on the basis of the volume of the pretreatment liquid.

Examples of a commercially available product of the surfactant that is a compound having an acetylene group include SURFYNOL 104, SURFYNOL 440, and SURFYNOL 465 (Product Name, manufactured by Nissin Chemical Industry Co., Ltd.). The content of the compound having an acetylene group may be 0.1 to 5 g/L, or 0.3 to 1 g/L, on the basis of the volume of the pretreatment liquid.

The pretreatment liquid may contain a dispersant. The dispersant may be a polymer having a monomer unit derived from a maleic acid, and examples of a commercially available product thereof include MALIALIM AKM-0531 (Product Name, manufactured by NOF CORPORATION). The content of the dispersant may be 0.1 to 5 g/L, or 0.3 to 1 g/L, on the basis of the volume of the pretreatment liquid.

The resist layer 3 and the pretreatment liquid are selected such that the mass change rate of the resist layer 3 when the resist layer 3 before being exposed and developed is immersed in the pretreatment liquid is-2.0% by mass or more. Here, the mass change rate is a value calculated by the following expression:

$$\text{Mass change rate (\% by mass)}=\{(W1-W0)/W0\}\times 100.$$

W0 is the mass of the resist layer 3 before being immersed in the pretreatment liquid, and W1 is the mass of the resist layer 3 after a laminated body including the resist layer 3 and a copper foil covering the entire one surface of the resist layer 3 is immersed in the pretreatment liquid at the pretreatment temperature for 30 minutes. The mass change rate is a value reflecting balance between the amount of component eluted from the resist layer 3 to the pretreatment liquid and the amount of pretreatment liquid absorbed in the resist layer 3 while the resist layer 3 is immersed in the pretreatment liquid. According to the findings of the present inventors, in a case where the resist layer 3 and the pretreatment liquid are combined such that the mass change rate is −2.0% by mass or more, the occurrence of a fine black part in the copper plating layer 21 is remarkably suppressed. From the same viewpoint, the mass change rate may be −1.0% by mass or more, or −0.5% by mass or more. From the viewpoint of suppressing the peeling of the wiring 2, the mass change rate may be 3.0% by mass or less. In consideration of the solubility of each component configuring the resist layer 3 with respect to the pretreatment liquid, or the like, the resist layer 3 and the pretreatment liquid can be selected such that the mass change rate is in a predetermined range.

The copper plating layer 21 filling the opening 3A is formed on the pretreated surface of the metal layer 20 by the electrolytic plating. After that, the resist layer 3 is peeled off from the metal layer 20. A portion of the metal layer 20 that is exposed by the peeling of the resist layer 3 is removed by a general method such as etching. As a result thereof, the wiring 2 including the metal layer 20 remaining on the support body 1, and the metal plating layer 21 is formed.

The electrolytic plating layer 21 and the wiring 2 may include a linear portion, and the width thereof may be 5 to 20 lam. In other words, the line/space (LIS) of the wiring 2 may be 5 μm/5 μm to 20 μm/20 μm. According to the method of the present disclosure, even in the case of such a fine wiring, defects such as the peeling and the collapse of the wiring may be less likely to occur.

The wiring board 10 that is produced by the steps described above includes the support body 1, and the wiring 2 including the metal layer provided on the support body 1 and the copper plating layer 21 formed on the metal layer 20. The number of black parts observed in the copper plating layer 21 may be 8 or less per 1 μm of a width parallel to the main surface of the support body 1 of the wiring 2. Here, the number of black parts indicates the number of black parts with the maximum width of less than 0.3 μm, which are observed by a scanning electron microscope.

EXAMPLES

The present invention is not limited to Examples described below.

1. Material

Pretreatment Liquid

As a pretreatment liquid for pretreating a seed layer before electrolytic plating, an acidic pretreatment liquid A containing alcohol (Alcohol Content: 0.7% by mass) and an acidic pretreatment liquid B containing alcohol (Alcohol Content: 0.6% by mass), and pure water were prepared.

Resist Film

A photosensitive resist film A and a photosensitive resist film B (both are manufactured by Showa Denko Materials Co., Ltd.) for forming a circuit were prepared. The thickness of these photosensitive resist films was 25 μm.

Mass Change of Resist Film Due to Immersion to Pretreatment Liquid

A copper clad laminated sheets for a printed wiring board with 50 mm square and a thickness of 0.45 mm were prepared, and the mass of each copper clad laminated sheets was measured. The resist film A or B was laminated on both surfaces of each copper clad laminated sheet by using a laminator (GK-13DX, manufactured by Lami Corporation Inc.) to form a laminated body including the resist film, and a copper foil of the copper clad laminated sheet covering the entire one surface of the resist film. A lamination temperature was 110° C., a lamination rate was 1.4 m/min, and a lamination pressure was 0.5 MPa. The total mass of the copper clad laminated sheet and the resist film was measured. The mass of each copper clad laminated sheet was subtracted from the measured mass to obtain the initial mass W0 of the resist film (a resist layer).

Next, the copper clad laminated sheet on which the resist film was laminated was impregnated in the pretreatment liquid A at 40° C., the pretreatment liquid B at 45° C., or the pure water at 25° C. for 30 minutes. The copper clad laminated sheet and the resist film after being impregnated were dried by heating at 70° C. for 30 minutes in an oven. The total mass of the copper clad laminated sheet and the resist film after being dried was measured. The mass of each copper clad laminated sheet was subtracted from the measured mass after being dried to obtain the mass W1 of the resist film (the resist layer) after being immersed in the pretreatment liquid. According to the following expression, the mass change rate (%) of the resist film (the resist layer) due to the immersion to the pretreatment liquid was calculated.

$$\text{Mass change rate }(\%)=\{(W1-W0)/W0\}\times 100$$

2. Formation of Wiring

By adopting a combination of the resist film and the pretreatment liquid shown in Table 1, a wiring was for pied in accordance with the following procedure.

Formation of Insulating Resin Layer

A copper clad laminated sheet for a printed wiring board with 50 mm square and a thickness of 0.45 mm (manufactured by Showa Denko Materials Co., Ltd.), and an insulating material for forming an insulating resin layer (Ajinomoto Build-up Film GX-92, manufactured by Ajinomoto Fine-Techno Co., Inc.) were prepared. The insulating material included a support film, an insulating curable resin film provided on the support film, and a protective film. The protective film was peeled off from the insulating material, and the exposed curable resin film was placed on the copper clad laminated sheet. The placed curable resin film was pressed by using a press type vacuum laminator (MVLP-500, manufactured by Meiki Co., Ltd.), and was pressure-bonded to the copper clad laminated sheet. In a condition of the pressing, a heat plate temperature of a press was 80° C., a vacuuming time was 20 seconds, a press time was 60 seconds, an atmospheric pressure was 4 kPa or less, and a pressure was 0.4 MPa. After that, in the oven, heating was performed at 180° C. for 30 minutes, and then, at 190° C. for 60 minutes to cure the curable resin film, and an insulating resin layer was formed on the copper foil of the copper clad laminated sheet.

Next, the laminated body including the insulating resin layer and the copper clad laminated sheet was sequentially immersed in a mixed aqueous solution of 500 mL/L of a wet solution (Swelling Securiganth, manufactured by Atotech) and 3 g/L of NaOH at 80° C. for 15 minutes, in pure water at a room temperature for 2 minutes, in a mixed aqueous solution of 640 mL/L of a desmear liquid (Compact CP, manufactured by Atotech) and 40 g/L of NaOH at 80° C. for 20 minutes, in pure water at for 2 minutes, in a mixed aqueous solution of 100 mL/L of an acidic solution (Reduction Securiganth, manufactured by Atotech) and 50 mL/L of a 98% sulfuric acid at 40° C. for 5 minutes, and in pure water at a room temperature for 1 minute. According to the immersion to the desmear liquid, the surface of the insulating resin layer was roughened.

Formation of Seed Layer

The laminated body including the roughened insulating resin layer and the copper clad laminated sheet was sequentially immersed in mL/L of an aqueous solution of an acidic pretreatment reagent for electroless plating (Product Name: MCD-PL, manufactured by C. Uyemura & Co., Ltd.) at 40° C. for 5 minutes, in pure water at 40° C. for 1 minute, in pure water at a room temperature for 1 minute, in an aqueous solution of a 10% sulfuric acid at a room temperature for 1 minute, in pure water at a room temperature for 1 minute, in a mixed aqueous solution (MDP-2 Concentration: 10 mL/L, 95% Sulfuric Acid: 1 mL/L) of a pre-dip reagent (Product Name: MDP-2, manufactured by C. Uyemura & Co., Ltd.) and a sulfuric acid at a room temperature for 2 minutes, in a mixed liquid (MAT-SP Concentration: 50 mL/L, NaOH: 1.6 g/L) of an activator reagent (Product Name: MAT-SP, manufactured by C. Uyemura & Co., Ltd.) and NaOH at 40° C. for 5 minutes, in pure water at a room temperature for 1 minute, a mixed liquid (MRD-2-C Concentration: 10 mL/L, MAB-4-C Concentration: 50 mL/L, MAB-4-A Concentration: 10 mL/L) of a reducer reagent (Product Name: MRD-2-C, MAB-4-C, and MAB-4-A, manufactured by C. Uyemura & Co., Ltd.) at 35° C. for 3 minutes, in pure water for 1 minute, 50 mL/L of an aqueous solution of an accelerator reagent (Product Name: MEL-3A, manufactured by C. Uyemura & Co., Ltd.) at a room temperature for 1 minute, in a mixed liquid (PEA-6A Concentration: 100 mL/L, PEA-6-B-2× Concentration: 50 mL/L, PEA-6-C Concentration: 14 mL/L, PEA-6-D Concentration: 15 mL/L, PEA-6-E Concentration: 50 mL/L, Formaldehyde Concentration: 5 mL/L) of an electroless plating reagent (Product Name: PEA-6A, PEA-6-B-2X, PEA-6-C, PEA-6-D, and PTA-6-E, manufactured by C. Uyemura & Co., Ltd.) and formaldehyde at 36° C. for 15 minutes, and in pure water for 1 minute. According to the electroless plating including such an immersion treatment, the metal layer was formed as the seed layer. The formed seed layer was annealed by heating for 30 minutes in the oven at 150° C. In the case of Example 2, the copper foil was laminated on the insulating resin layer to form the seed layer. Arithmetic surface roughness Ra and an average height Rc (JIS B 0601: 2013 (ISO 4287: 1997, Amd. 1: 2009)) of the surface of the seed layer on a side opposite to the insulating resin layer were measured by using a laser microscope.

Formation of Resist Layer

The resist film A or B was laminated on the seed layer by using a laminator (GK-13DX, manufactured by Lami Corporation Inc.). A lamination temperature was 110° C., a lamination rate was 1.4 m/min, and a lamination pressure was 0.5 MPa. After the lamination, the resist film was left to stand for 30 minutes, and was exposed by using a mask aligner (ML-320FSAT, manufactured by Mikasa Co., Ltd.), a bandpass filter (HB0405, manufactured by Asahi Spectra Co., Ltd.), and a negative photomask. An exposure amount was 45 $mJ/cm^2$. After the exposure, the resist film was left to stand for 30 minutes, the protective film of the resist film was peeled off, and a resist layer having a pattern including a linear opening with a width of 10 μm to which the seed layer was exposed was formed by development using an aqueous solution of 1.0% sodium carbonate. The development was performed by spraying the developer for 100 seconds with an ultra-high-pressure spin developing device (manufactured by Blue Ocean Technology, Ltd.), and then, by spraying pure water as a rinse liquid for 100 seconds. A development temperature was 30° C., the number of rotations was 500 rpm, a spray pressure was 0.18 MPa, a movement distance of a spray nozzle head was 7.2 cm, and a movement rate of the spray nozzle head was 10 cm/s.

Pretreatment

The laminated body including the seed layer, the resist layer, and the copper clad laminated sheet was immersed in the pretreatment liquid A at 40° C., the pretreatment liquid B at 45° C., or in the pure water at a room temperature (25° C.). After that, the laminated body including the seed layer, the resist layer, and the copper clad laminated sheet was sequentially immersed in pure water at 50° C. for 1 minute, in pure water at 25° C. for 1 minute, and in an aqueous solution of a 10% sulfuric acid at 25° C. for 1 minute.

Electrolytic Plating

The laminated body after the pretreatment was immersed in an electrolytic plating liquid, and an electrolytic plating layer was formed on the seed layer in a condition of 25° C. and a current density of 10 A/$dm^2$ for 10 minutes. After that, the laminated body that included the wiring including the seed layer and the copper plating layer was immersed in pure water at a room temperature for 1 minute. As the electrolytic plating liquid, a mixed liquid containing 120 g/L of a copper sulfate pentahydrate, 7.3 L of an aqueous solution of 220 g/L of a 96% sulfuric acid, 0.25 mL of a hydrochloric acid, 92 mL of TOP LUCINA NSV-1 (Product Name, manufactured by OKUNO Chemical Industries Co., Ltd.), 11.5 mL of TOP LUCINA NSV-2 (Product Name, manufactured by OKUNO Chemical Industries Co., Ltd.), and 23 mL of TOP LUCINA NSV-3 (Product Name, manufactured by OKUNO Chemical Industries Co., Ltd.) was used.

3. Evaluation

Black Part

Figure 2:
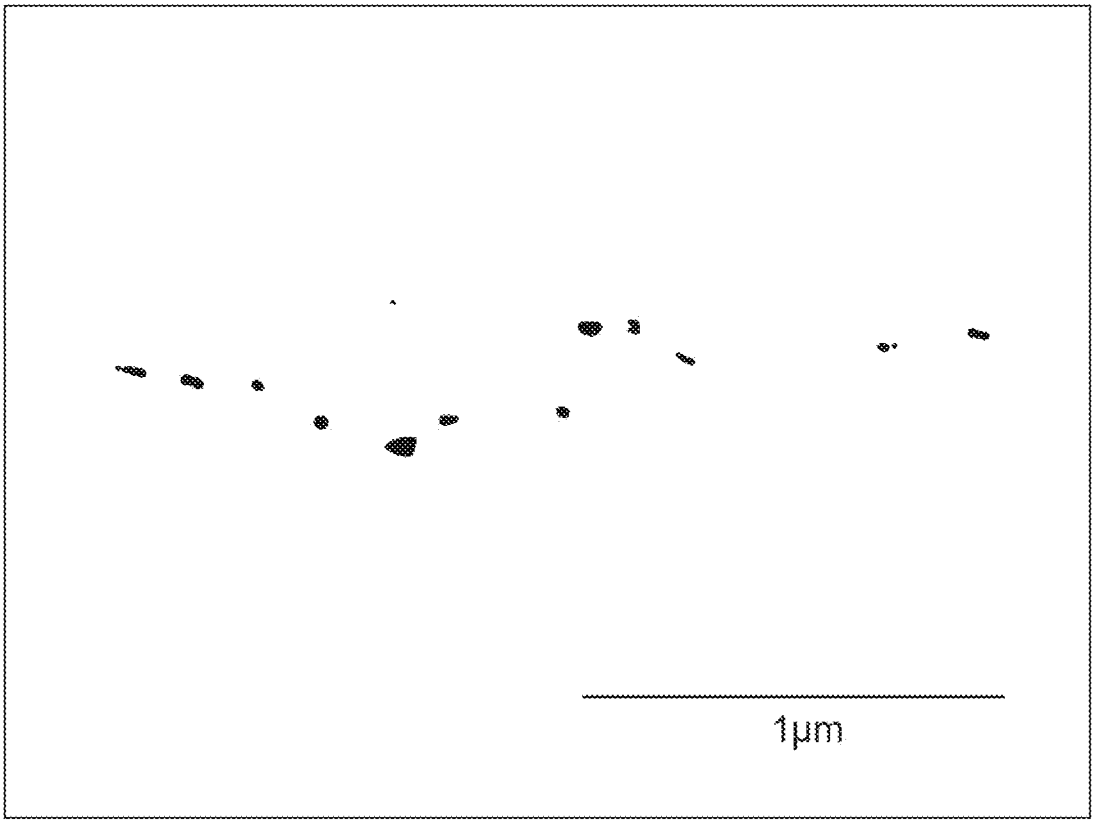
FIG. 2 is an example of an image in which an electron microscopic image in the vicinity of an interface between a metal layer and a copper plating layer is binarized.

The formed wiring was processed by using a focused ion beam device (MI4050, manufactured by Hitachi High-Tech Corporation) to prepare a test piece having a sectional surface in which the vicinity of the interface between the seed layer and the electrolytic plating layer was exposed. In the vicinity of the interface between the seed layer and the electrolytic plating layer on the sectional surface of the test piece, eight spots were captured at a magnification of 50000 by using a scanning electron microscope (SU8200, manufactured by Hitachi High-Tech Corporation). The obtained picture of the sectional surface was binarized such that only minute black parts existing between the layers of electroless copper plating and electrolytic copper plating was black, and the number of black parts was recorded. FIG. 2 is an example of an image in which an electron microscopic image is binarized. The number of black parts per 1 μm of a width in an interface direction was calculated. Image editing software ImageJ was used for binarization. In Table 1, the average value of the number of black parts at eight observation positions is shown.

Wiring Forming Properties

The wiring was observed, and the presence or absence of the collapse of the wiring or the peeling of the wiring at ten spots was checked.

TABLE 1

| | | Ex. 1 | Ex. 2 | Ex. 3 | Ex. 4 | Ex. 5 | Comp. Ex. |
|---|---|---|---|---|---|---|---|
| Seed layer | Type | Electro-less plating | Copper | Electro-less plating | Electro-less plating | Electro-less plating | Electro-less plating |
| | Surface roughness Ra (μm) | 0.25 | 0.20 | 0.35 | 0.25 | 0.25 | 0.25 |
| | Average height Rc (μm) | 1.02 | 0.70 | 1.39 | 1.02 | 1.02 | 1.02 |
| Resist film | | A | A | A | B | A | A |
| Pretreatment liquid (Alcohol content, wt %) | | A (0.7) | A (0.7) | A (0.7) | A (0.7) | B (0.6) | Pure water |
| Mass change of resist film (wt %) | | +1.5 | +1.5 | +1.5 | +1.9 | +1.1 | −3.3 |
| Number of black parts (pieces/μm) | | 2.8 | 2.2 | 4.2 | 2.0 | 2.5 | 12.1 |
| Collapse and peeling of wiring | | None | None | None | None | None | None |

As shown in Table 1, it was confirmed that the combination of the pretreatment liquid and the resist film selected such that the mass change rate of the resist film when the resist film was immersed in the pretreatment liquid was −2.0% by mass or more results in effectively suppressed occurrence of the black part in the vicinity of the interface between the seed layer (the metal layer) and the electrolytic plating layer.

REFERENCE SIGNS LIST

1: support body, 2: wiring, 3: resist layer, 20: metal layer, 21: copper plating layer, 10: wiring board.

The invention claimed is:

1. A method for producing a wiring board, comprising:

forming a resist layer on a metal layer provided on a support body;

forming a pattern including an opening to which the metal layer is exposed on the resist layer by exposing and developing the resist layer;

pretreating a surface of the metal layer exposed into the opening by bringing the surface into contact with a pretreatment liquid at a predetermined pretreatment temperature; and forming a copper plating layer on the metal layer by electrolytic plating, in this order, wherein the resist layer and the pretreatment liquid are selected such that a mass change rate of the resist layer when the resist layer before being exposed and developed is immersed in the pretreatment liquid is −2.0% by mass or more, the mass change rate is a value calculated by the following expression:

$$\text{Mass change rate (\% by mass)} = \{(W1 - W0)/W0\} \times 100,$$

W0 is a mass of the resist layer before being immersed in the pretreatment liquid, and W1 is a mass of the resist layer after a laminated body including the resist layer and a copper foil covering entire one surface of the resist layer is immersed in the pretreatment liquid at the pretreatment temperature for 30 minutes, and the pretreatment liquid is an acidic pretreatment liquid containing alcohol, a content of the alcohol being 0.2 to 5% by mass on the basis of a mass of the pretreatment liquid, and wherein an average height Rc of the surface of the metal layer on the copper plating layer side is 0.7 to 1.3 μm.

2. The method according to claim 1, wherein arithmetic surface roughness Ra of the surface of the metal layer is 0.20 to 0.30 μm.

3. The method according to claim 1, wherein the copper plating layer includes a linear portion having a width of 5 to 20 μm.

4. The method according to claim 1, wherein the metal layer is a layer provided on the support body by electroless plating.

5. The method according to claim 1, wherein the content of the alcohol is 0.6 to 0.7% by mass on the basis of the mass of the pretreatment liquid.

* * * * *